United States Patent [19]

Sukegawa et al.

[11] Patent Number: 5,487,040
[45] Date of Patent: Jan. 23, 1996

[54] SEMICONDUCTOR MEMORY DEVICE AND DEFECTIVE MEMORY CELL REPAIR CIRCUIT

[75] Inventors: Shunichi Sukegawa, Oume; Tetsuya Saeki, Tachikawa, both of Japan

[73] Assignees: Texas Instruments Incorporated, Dallas, Tex.; Hitachi Ltd., Japan

[21] Appl. No.: 90,848

[22] Filed: Jul. 12, 1993

[30] Foreign Application Priority Data

Jul. 10, 1992 [JP] Japan ..................... 4-207332

[51] Int. Cl.$^6$ ........................................ G11C 13/00
[52] U.S. Cl. ............... 365/200; 365/230.03; 365/225.7; 365/230.06; 395/182.05
[58] Field of Search .................... 365/200, 230.03, 365/210, 233, 225.7, 230.06; 371/10.1, 10.2, 10.3

[56] References Cited

U.S. PATENT DOCUMENTS 5,272,672  12/1993  Ogihara ..................... 365/200

Primary Examiner—David C. Nelms
Assistant Examiner—Huan Hoang
Attorney, Agent, or Firm—William E. Hiller; Richard L. Donaldson

[57] ABSTRACT

To provide a type of semiconductor memory device characterized by the fact that the area occupied by the redundant memory address decoder on the chip is minimized without reducing the redundancy of the defective memory, and hence the cost of the semiconductor memory device can be cut.

It has both redundant decoders that select the redundant memory in response to the all address bits and the redundant decoders which select the redundant memory group in response to a portion of the address bits, so as to increase the efficiency in saving the defective memory.

6 Claims, 9 Drawing Sheets

SEMICONDUCTOR MEMORY DEVICE AND DEFECTIVE MEMORY CELL REPAIR CIRCUIT

This invention pertains to a type of IC. More specifically, this invention pertains to a type of IC device formed on a semiconductor substrate, such as dynamic random access memory or other memory device.

PRIOR ART

The rapid development of the dynamic random access memory DRAM as a type of large scale IC semiconductor device is well known, such as the development from the 16K DRAM disclosed by Rao in U.S. Pat. No. 4,055,444 to the 1M DRAM disclosed by McElroy in U.S. Pat. No. 4,658,377, and further to 4M and 16M DRAM. At present, the 64M DRAM, which has more than 64 million memory cells and their periphery circuit formed on a single chip, is in the pilot manufacturing stage, and it is planned to perform mass production for it as the next-generation DRAM. At present, the designers of the 64M DRAM ultralarge scale IC (ULSI) semiconductor memory device are facing many problems. For example, one of the features with which people are concerned is how to eliminate defective memory cells. As indicated by the planar capacitor cell disclosed in U.S. Pat. No. 4,240,092 by Kuo and the trench capacitor cell disclosed by Baglee et al. in U.S. Pat. No. 4,721,987, the development of the ultralarge scale DRAM is promoted by the reduction in the memory cell geometry. For the 64M DRAM or an even higher integration degree, the geometry is extremely small, and the technology in the submicron range (smaller than 1 millionth of meter) has to be used for manufacturing. Consequently, the percentage of defective circuit and defective devices caused by particles, which were not formerly a serious problem in the conventional manufacturing operation, will increase for such minute geometry.

FIG. 1 shows a 64M bits dynamic random access memory chip known as 64M DRAM prepared using the submicron technology. This chip is equally divided to eight quadrants of 8M bits. Each of the eight memory quadrants contains eight 1M bits memory blocks. Each memory block is made of two 512K bits portions. The column decoder (C. dec) is placed at the center of each memory quadrant along the axial line in the longitudinal direction as viewed from above the chip. Row decoder (R. dec) is placed along the axial line in the transverse direction of the chip adjacent to the corresponding memory quadrant. The peripheral circuit containing input/output buffer (A. buffer, I/O buffer), timing generator (S. R. timer, Row. clock) and control circuit (Row red.) is placed at the central portion along both horizontal axis and vertical axis of the chip. In addition, the bonding pad is placed at the center along the vertical axis of the chip.

FIG. 2 is a plane view showing a portion of the memory array 12. Memory cells of memory array 12 are of the improved trench capacitor type made using submicron technology. The memory cell has an area of about 4.8 $\mu m^2$, and is placed for every two word lines. Bit lines 17 are made of 3-layer polycide for improving the tolerance with respect to noise. Word lines 19 are made of polysilicon, and a word line is connected for every 64 bits. In the prior art, redundant circuits were introduced for repairing the defective memory array.

FIG. 3 is an oblique view illustrating a portion of memory array 12. Bit line 17 is connected to the each memory cells and is insulated from word line 19 by an interlayer insulating oxide layer. Word line 19 has a submicron width of about 0.6 $\mu m$. Word line 19 forms the gate of transfer gate 43. It is isolated from substrate 10 by means of a thin oxide layer. Other word lines 19, 19 pass through over upper trench capacitors 44, 45, and are connected to the other trench capacitors not shown in the figure. They are isolated from polysilicon field plate 48 by means of an oxide layer. The gate portion of word line 19, source 56 and drain 58 form transfer gate 43. An arsenic layer 50 implanted on the outer side of the wall of the trench capacitor forms the $N^+$-type memory node of the capacitor. On the wall of the trench capacitor, a layer 52 of oxide and nitride which acts as a dielectric layer between the implanted arsenic portion on the trench wall and polysilicon field plate 48 is formed. Transfer gate 43 and trench capacitor 44 form memory cell 46.

FIG. 4 shows the redundant address coincidental circuit. It has routes among transistors selected from multiple transistors. A laser beam or a high voltage is applied to burn the fuses of the portion corresponding to the prescribed address bits.

FIG. 5 shows the redundant mechanism for compensating defective memory cells of a 64M DRAM. This is carried out by replacing the defective memory with normally operable redundant memory. There are four redundant rows for the 512K bits memory block. These four row lines can be used at the same time. Thirty two decoders can be programmed at will for each redundant row. Each redundant row decoder has a 13-bit row address. Fuses are used for the row redundant program. On average, in a single repair, 12 fuses are burned. The row redundancy adopts a method that allows ANY TO ANY programming for realizing a high yield. When this ANY TO ANY redundant mechanism is adopted, the 64 redundant rows present in one quadrant can be allotted selectively to all quadrants, including the present quadrant. In the operation of this redundant function, with the aid of the output of the 32 fuse decoders commonly connected to the row address bus, a memory selection driver MS is driven to specify the memory block constituted by the prescribed 512K memory cells. Among these prescribed memory cells, four redundant row lines are activated. At the same time, by selecting the activated four redundant row lines 1–4, the defective bit can be repaired. When the four lines are selected at the same time, the defects caused by short-circuits among the word lines can be corrected. Consequently, the redundancy can be increased to about 6 times that of the fixed or flexible fuse decoder with the redundant memory set in the prescribed memory block. However, since the number of fuse decoders is increased, and the redundant memory address bits should be about the total address bits, the number of fuses that can be programmed becomes larger than that in the conventional case; and the redundant memory placed in each quadrant can be replaced to the main memory of the other quadrants; hence, increase in the data lines is not hampered. In the above, the redundant function has been displayed for the row address. However, the same configuration may also be used to program the redundant mechanism for the column address. In addition, 2-stage decoding can be performed by means of 2-stage programmable predecoder and fuse decoder.

FIG. 6 shows the relationship between the number of defective memories in a prescribed area (abscissa) vs. redundancy (ordinate) for models A–E. The broken line A represents model of the 64M DRAM, while the solid lines B and E show the other models of the 64M DRAM. Although the area remains the same for the various memory cells, they nevertheless have different redundancies due to their different quadrants, word configurations, and bit line configurations. On the other hand, C and D show the redundancy configurations when the 16M DRAM, etc. are used. All of the redundancies are calculated on the basis of the number of defects in the same unit area. Here, attention should be paid to the fact that the ANY TO ANY method tolerates about four times the defective memory of those in the conventional case in the stage with yield over 80% as an indication of the maturing period on the basis of the learning curves of the semiconductor devices. That is, for the defective devices containing four times as many defective memory cells as in the conventional method without redundant repair, by using the ANY TO ANY method, only 20% of the chips have to be disposed of, while the remaining chips can be assembled and shipped after passing the electrical tests for shipment.

The other purposes, advantages, and features of this invention are clear to the specialists in the field as explained in the following with reference to embodiments.

The major problem with the conventional configuration of the address redundant coincidental circuit is as follows: there should be address decoders for selecting multiple redundant word lines for repairing the word line short-circuit defects for the redundant address decoders including fuses, and there should be a necessary number of decoders as related to the memory blocks for repairing defects in one word line or defects in 1-bit memory cell. Consequently, the effective area is reduced, and the integration density of the circuit is hampered. In particular, the fuses must have an area appropriate for use as the target of laser beams. Consequently, they cannot be made as small as the transistors. As a result, it is necessary to reduce the redundant address decoders.

The configuration of the redundant address decoder circuit of this invention consists of multiple memory array blocks, multiple redundant word line groups placed in each memory block, a first redundant memory decoder which can energize the word line group at the same time, a second redundant memory decoder which selects one or several redundant word lines of the energized redundant word lines, and a redundant mechanism which can be programmed to use the redundant memory to replace the defective memory in any other memory block.

SUMMARY OF THE INVENTION

By means of the redundant address decoder with the aforementioned configuration, a defective bit can be replaced by any one redundant word line using the total address bit decoder, and a defect in the word line due to short circuit can be replaced by any redundant word line group by the half-address bit decoder; hence, the redundant memory mechanism corresponding to the defective mode can be realized using the smallest possible chip area.

Figure 1:
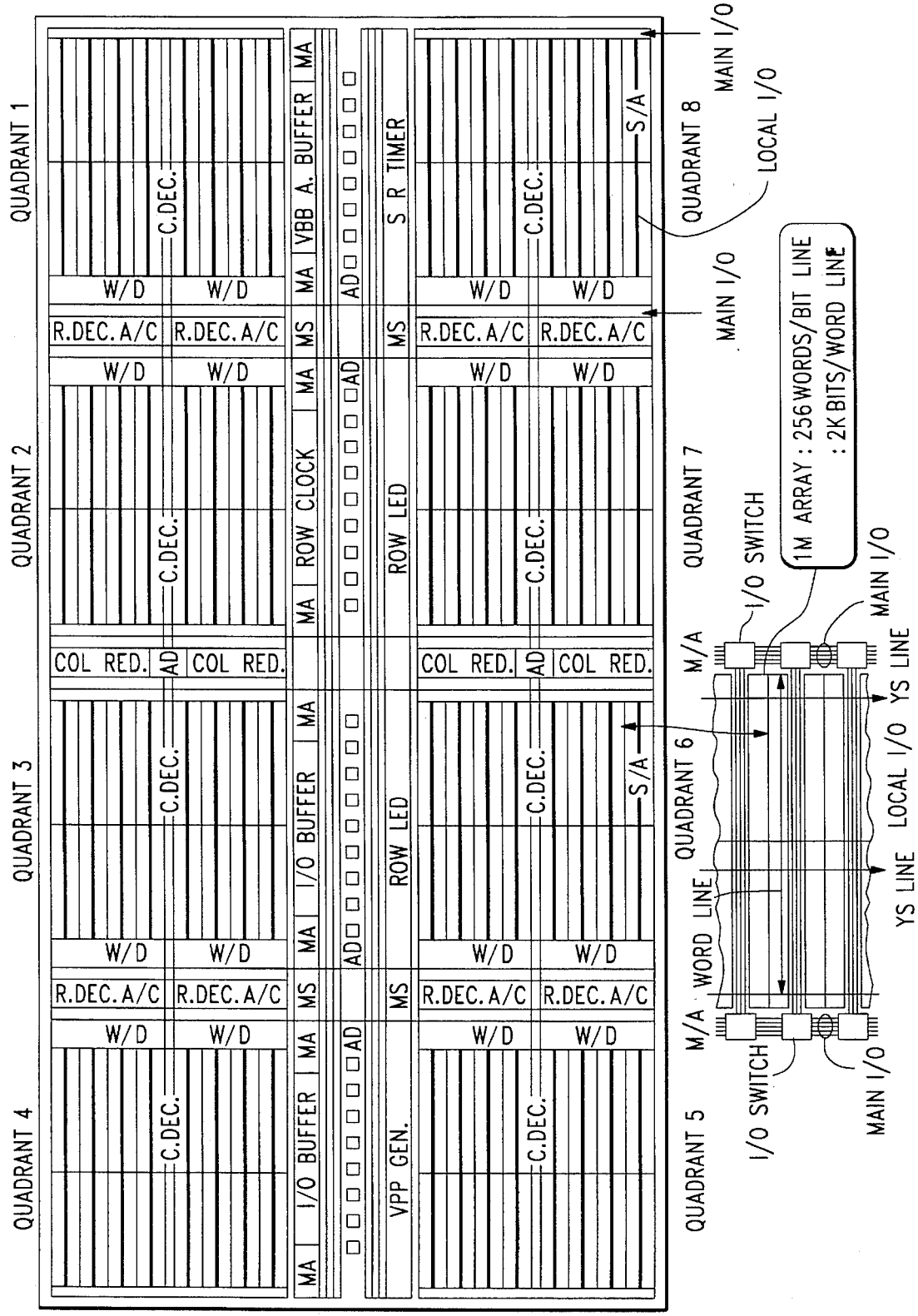
FIG. 1 is a plane view of the semiconductor memory chip.
Figure 2:
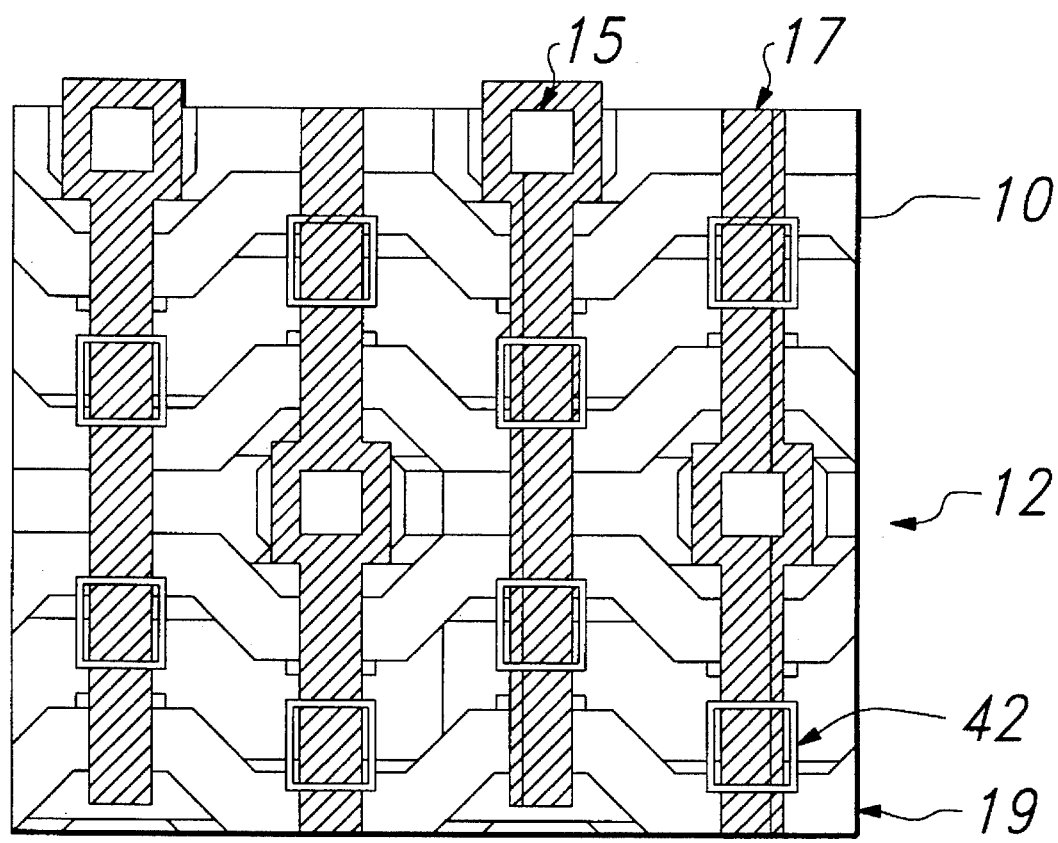
FIG. 2 is a plane view of a portion of the memory array.
Figure 3:
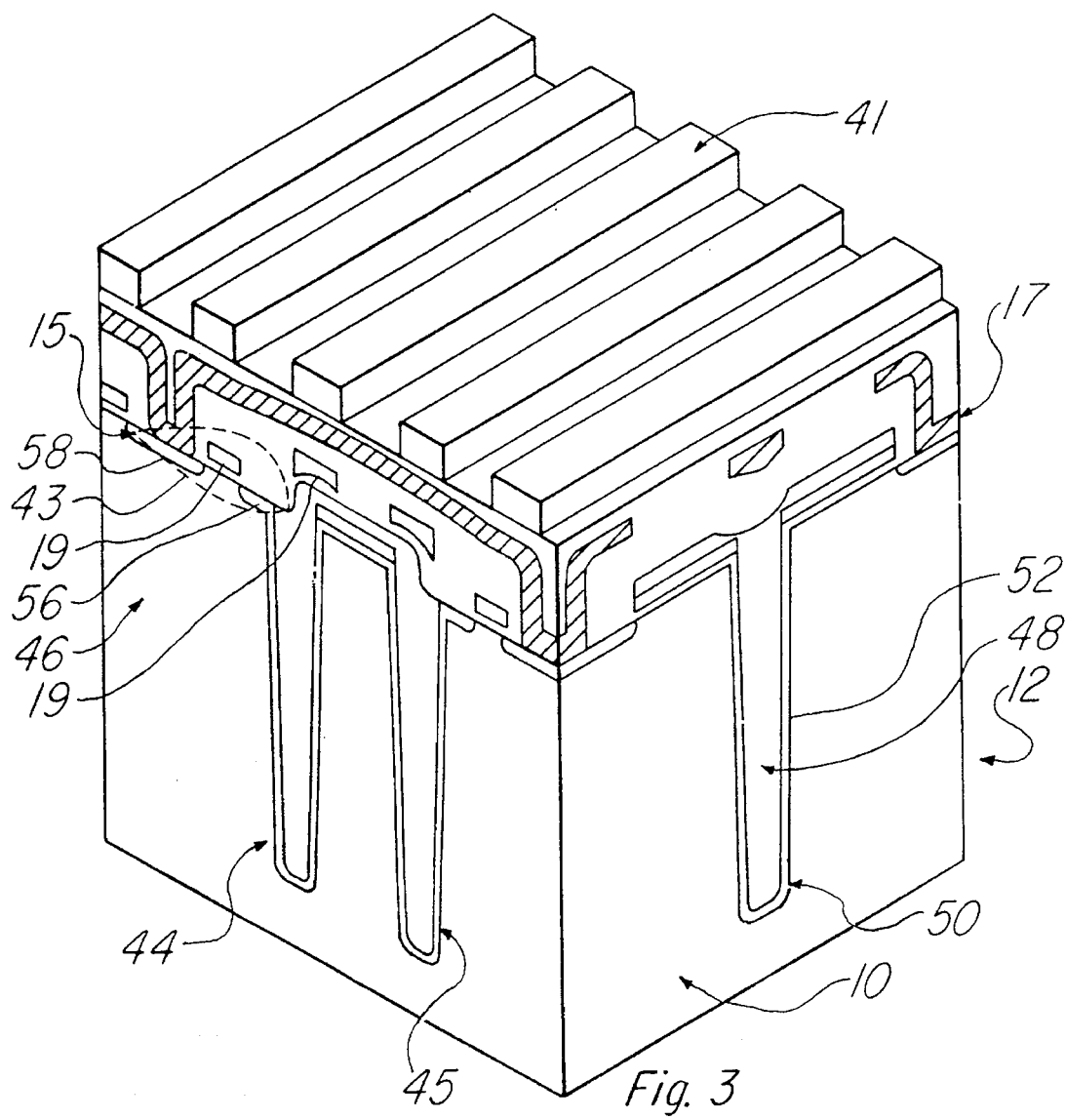
FIG. 3 is an oblique view of a portion of the memory array.
Figure 4:
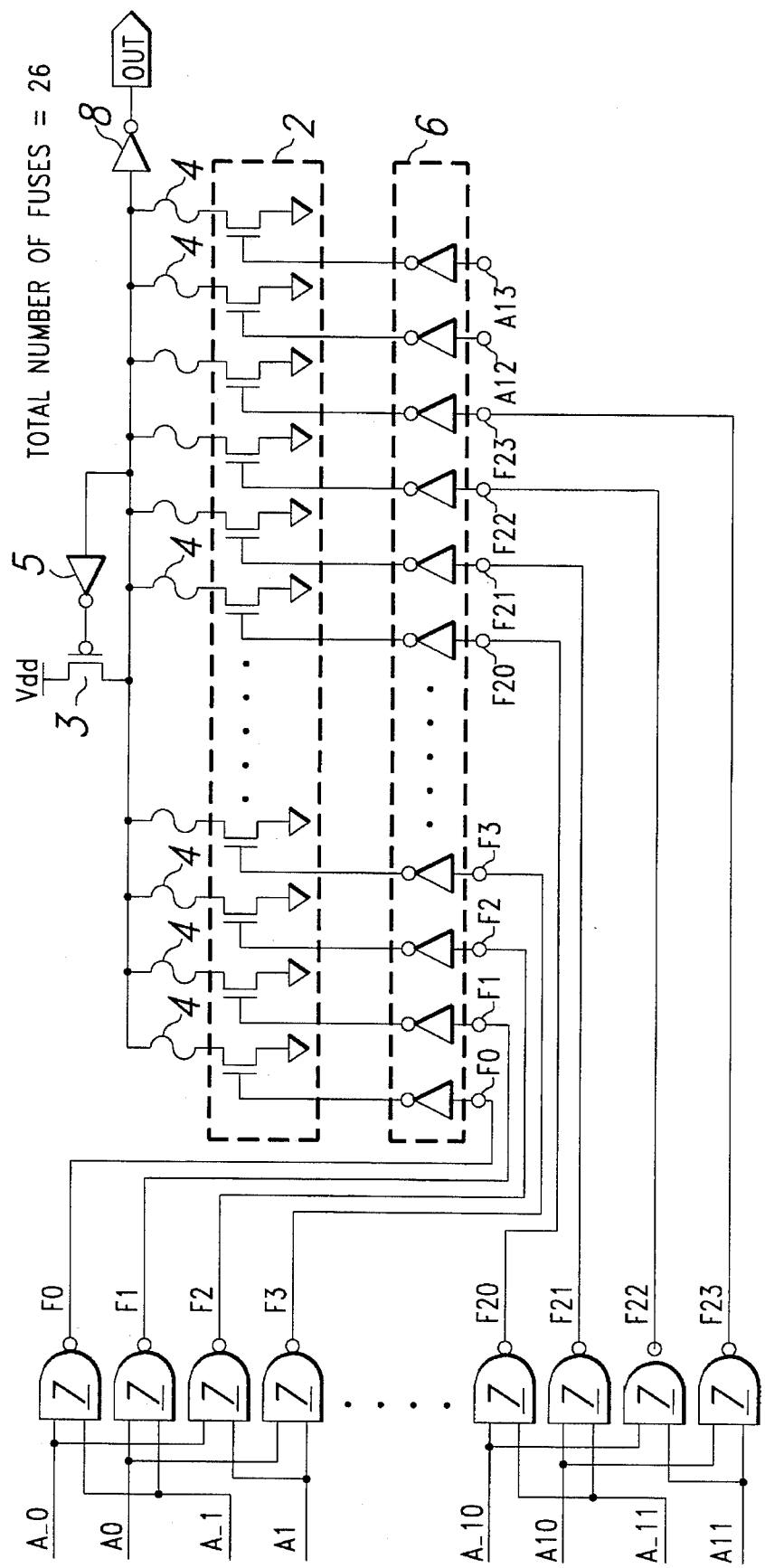
FIG. 4 shows the redundant memory address coincidental circuit.
Figure 5:
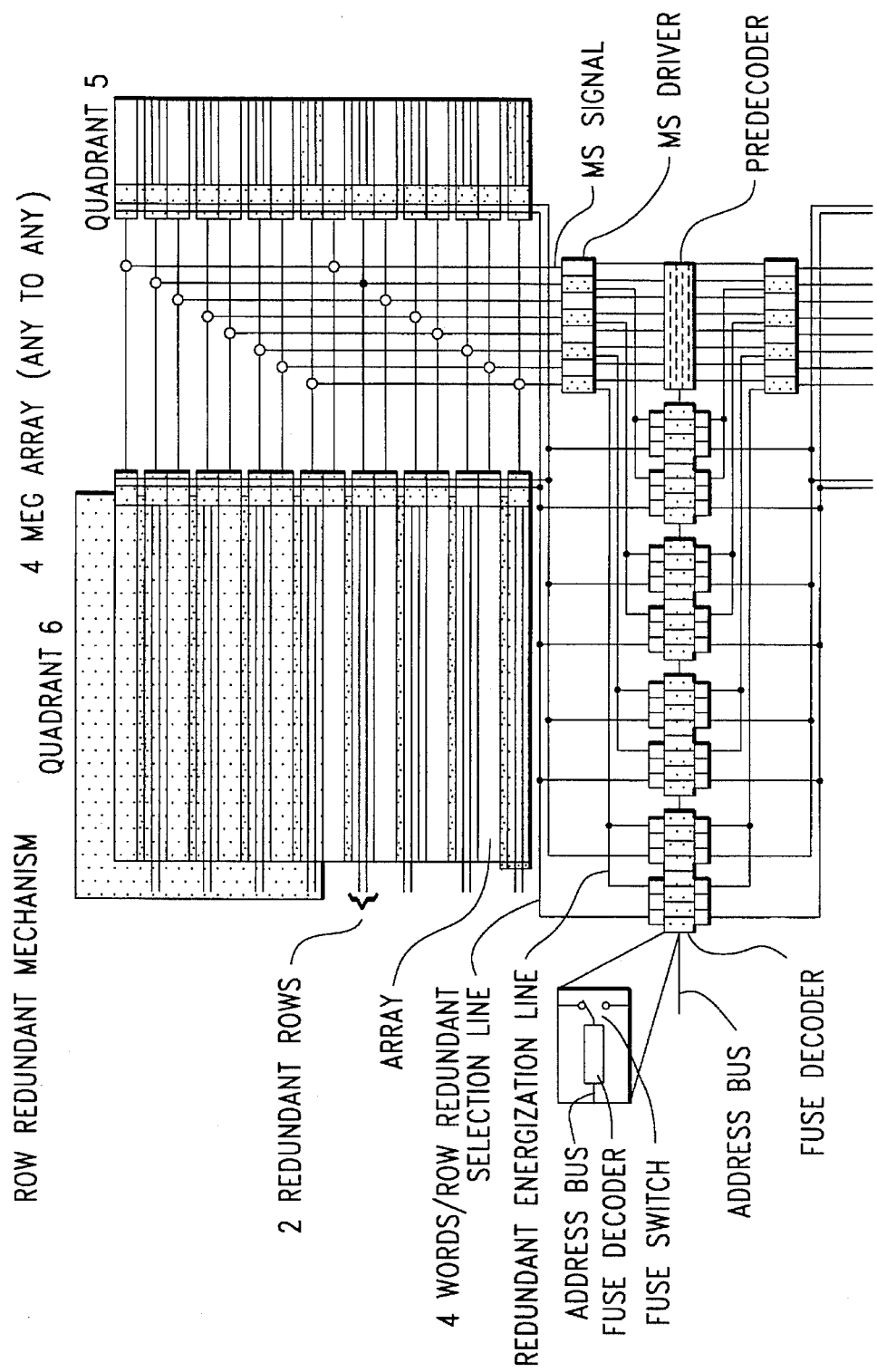
FIG. 5 shows a redundant mechanism for repairing defective memory cells of a 64[M] DRAM.
Figure 6:
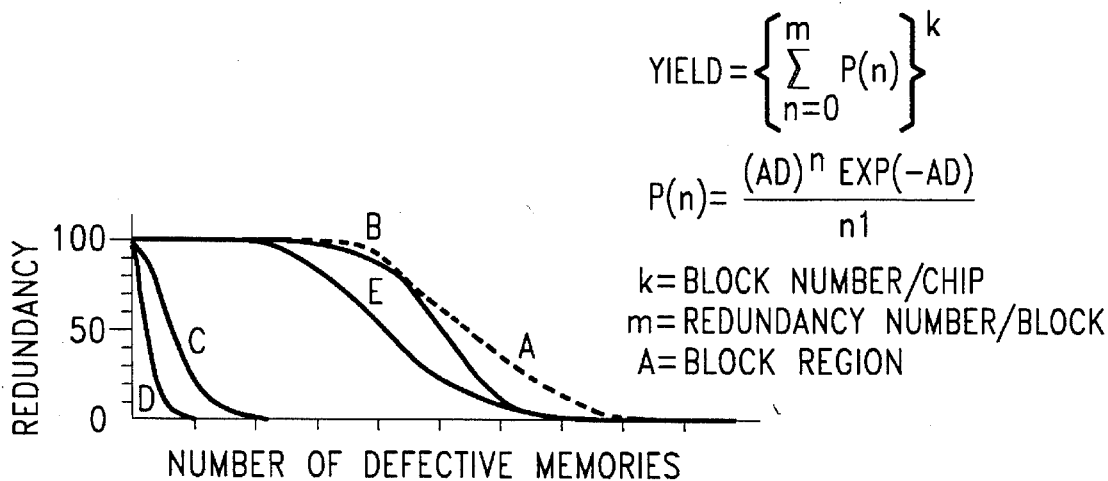
FIG. 6 shows the correlation between defective memory number and redundancy as represented by the yield.

2, transistor group
3, P channel transistor
4, fuse
5, 8, inverter
6, inverter group
7, "NAND" gate
10, semiconductor chip
12, semiconductor substrate
15, bit line contact
17, bit line
19, word line
28, drain
41, 42, interlevel connection line
43, transfer gate
44, 45, trench capacitor region
46, memory cell
48, field plate
50, impurity region
56, source region
70, 74, 76, 78, redundant word (row) line group
72, redundant word (row) selection line
82, 84, 88, 92, word line group selection fuse decoder
86, 90, 84, word line selection fuse decoder
100, 102, 104, 106, 108, 110, 112, 114, memory array block

DESCRIPTION OF THE PREFERRED EMBODIMENTS

In an embodiment of this invention, the memory device consists of multiple memory arrays which have memory cells arranged in a matrix configuration and have a redundant row group for replacing the defective row groups and peripheral circuit which reads information from the memory cells and then rewrites the information into the memory cells; this peripheral circuit contains a row redundant circuit which selects the redundant row group of the memory cell only in the memory array having the defective row group of the memory cells in response to the defective row group address of the memory cells, and a redundant circuit which selects one or several redundant row lines in the aforementioned redundant row group for replacing the defective bit. It is preferred that the row redundant circuit contain a row redundant decoder which can be programmed for maintaining the defective row address, and which allows 2-stage programming for maintaining the information for identifying the memory array containing the defective row of the memory cell.

In another embodiment of this invention, the memory device integrated on a single semiconductor substrate consists of multiple memory arrays, which have memory cells arranged in a matrix configuration and a redundant column group of memory cells for replacing the defective column group, and a column redundant circuit which selects the redundant column group of the memory cells only in the memory array having the defective column of memory cells in response to the address of the defective column group of the memory cells. It is preferred that the column redundant circuit contain a column redundant decoder which can be programmed for maintaining the defective address, and which allows 2-stage programming for maintaining the information for identifying the memory array containing the defective column of the memory cell. The memory device preferably contains a first redundant decoder which can be programmed to ensure maintaining the address of the defective row, receiving the row address, and generating the redundant row decoder signal and redundant row factor signal; a second redundant decoder which can be programmed to ensure maintaining the position of the array containing the defective row, receiving the redundant row decoder signal, and generating the array selection signal; and redundant energization circuit which connects to the redundant row factor energization signal of the second redundant decoder, the array selection signal of the second redundant decoder and the redundant row of the memory cell, and which energizes the selected redundant row of memory cells in the memory array having the defective row of memory cells.

According to this invention, the memory device may be the memory device disclosed in the claim and containing row redundant circuit and column redundant circuit.

Figure 7:
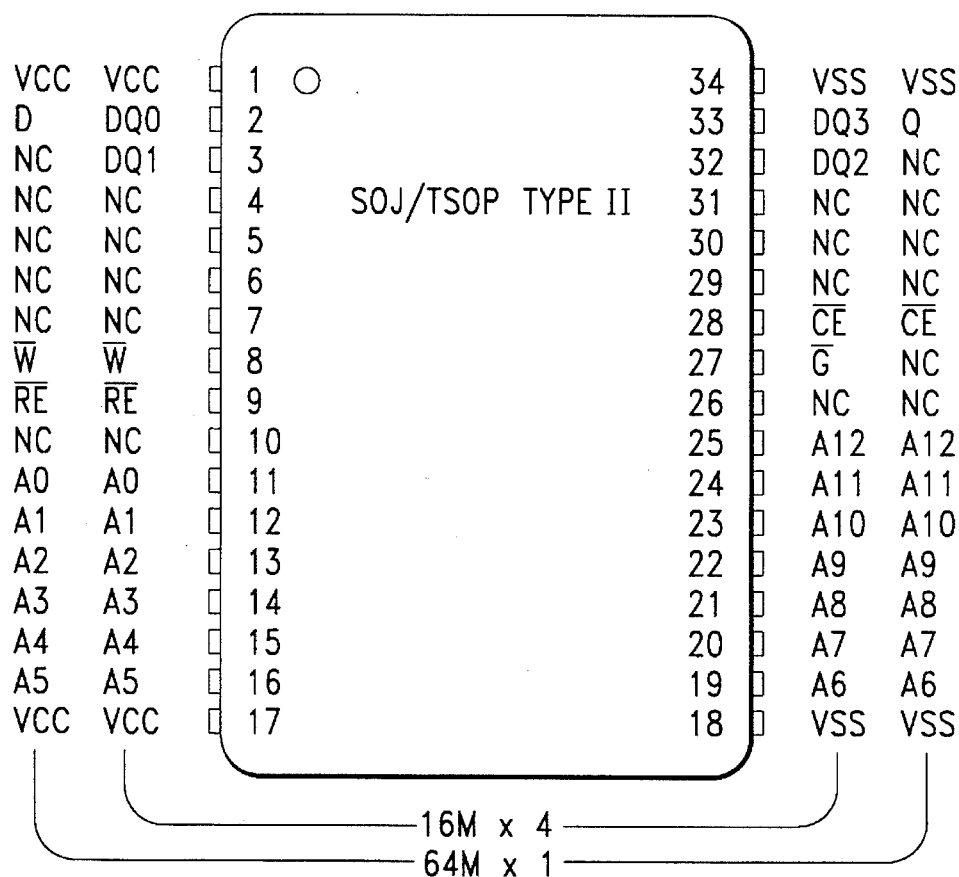
FIG. 7 shows the pin layout of the 64M DRAM with 64M×1 bit or 16M×4 bit configuration.

FIG. 7 shows a memory device with a bonding selectable 64M bits×1 or 16M bits×4 configuration. The selection can be performed by using the bonding wire to connect the prescribed bonding pad to VSS just as in the conventional technology in the manufacturing stage. Generally speaking, the specifications of the 64M DRAM can be determined for the memory array by means of time-shared input of a total of 13 bits of address input terminals A0–A12 arranged for 11–25 pins. Consequently, by taking the row address array, judgment can be made on whether the redundant memory decoder connected to the internal address bus is for selecting the standard memory array or for selecting the redundant memory array. In explanation of this invention, when the all address bits are mentioned, this means the all bits of the row and column address, namely, 26 bits, or the bits of the address of either row or column address. Consequently, the half-address bits refer to the 13 bits, or the upper 6 or 7 bits. These specifications can be changed by the designer to optimize the selection of the configuration of the output bits of the memory device.

Figure 8:
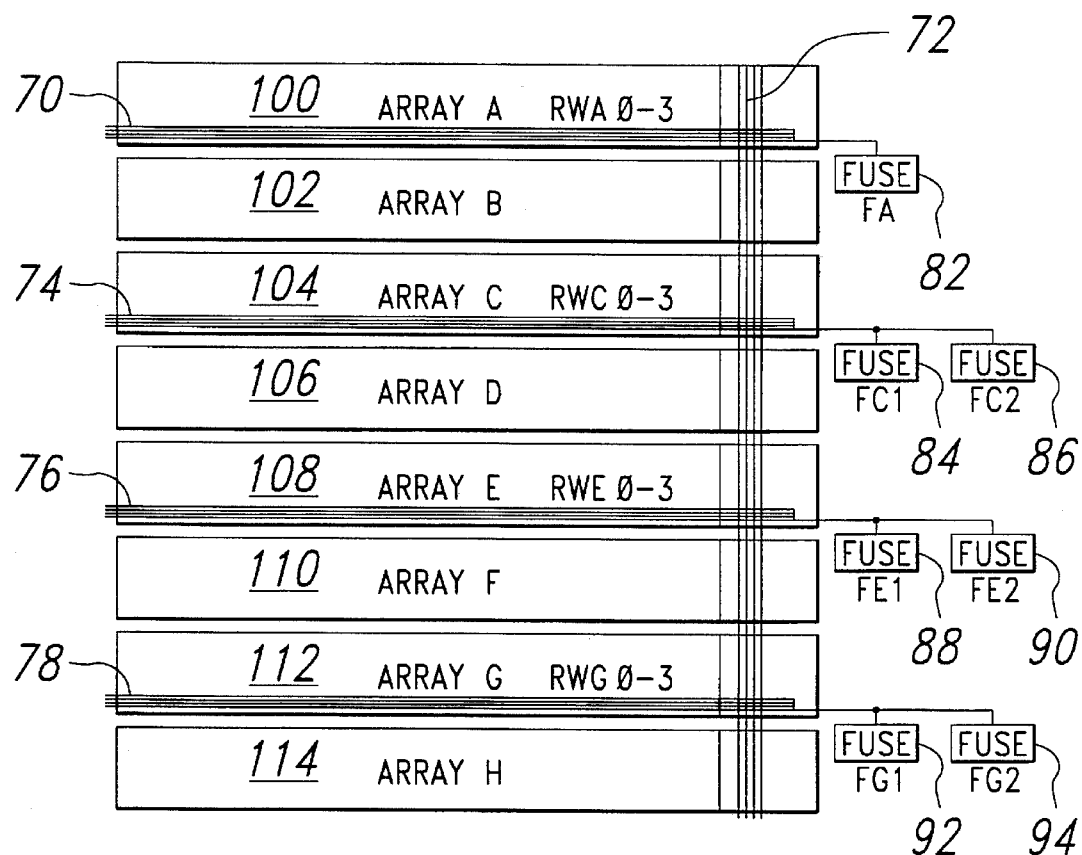
FIG. 8 shows the layout of the defective memory redundant mechanism.

FIG. 8 shows the redundant mechanism. In the redundancy programming, the memory quadrant has 8 blocks of 1 M bits memory arrays, each of which is divided into two 512K bits portions. Each memory array block has 4 row redundant memories. They can be selected at the same time by means of fuse decoder 82 or 92. Selected at the same time is the redundant row address by using about half the address bits instead of all of the bit data of the address bus. The number of the fuse decoders is half that in the case of the all address decoding; hence, the circuit area can be reduced. The simultaneous selection of the four row redundant memories is a very effective function in the case of the defect related to short circuit of the word lines. This is because the method in which the memory cell configuration is arranged for every two word lines and the four word lines are repaired at the same time in the case when a short circuit defect takes place for the adjacent word lines is more effective than the method in which each word line is address-decoded and repaired. The 4-line simultaneous selection method may be used not only in the case of defect caused by word line short circuit, but also in the case for defective bit. In this case, the standard memory is replaced by the redundant row. On the other hand, in the case when repair is to be made for a defective bit and a defect in one word line, the operation is performed by selecting one line of the row redundant memory. As the number of the row lines allows that redundancy is increased, the corresponding redundant memory address decoders are needed. When decoders corresponding to the defective bit in the all redundant row memory are arranged, the redundancy can be increased. However, the overall area of the chip is increased. Attention should be paid to this feature. Consequently, in the case when there are many defective word lines in the defect pattern intrinsic to the chip layout design, the number of decoders for repairing the defective bit can be reduced. In the submicron technology developed on the basis of progress in small-scale processing, the probability at which all of the defects are defective bits is small, while the defects caused by short circuit of the word lines are increased. In this case, fuse decoders 82–92 for selecting the four row redundant lines in response to the half-bit address are arranged to repair the defects caused by short circuit of word lines. The fuse decoders 86–94 for repairing the defective bit in response to the all address bits at the same time are arranged to reduce the chip area occupied by the total fuse decoders. In this configuration, there is no decrease in the redundancy, and the integration degree of the chip can be increased. In the redundant mechanism shown in FIG. 8, connection is made between one memory quadrant and fuse decoders. In the case when the ANY TO ANY method for the redundant mechanism is used, fuse decoders 82–94 can function for replacing the defective memory in the other quadrants not shown in the figure. In this case, the all bits means that all of the row address are used. When the fixed method is used instead of the ANY TO ANY method, it is enough to use only the row address characteristic for the memory block as the redundant mechanism in the block only. Consequently, the number of the fuse decoders can be further reduced.

Figure 9:
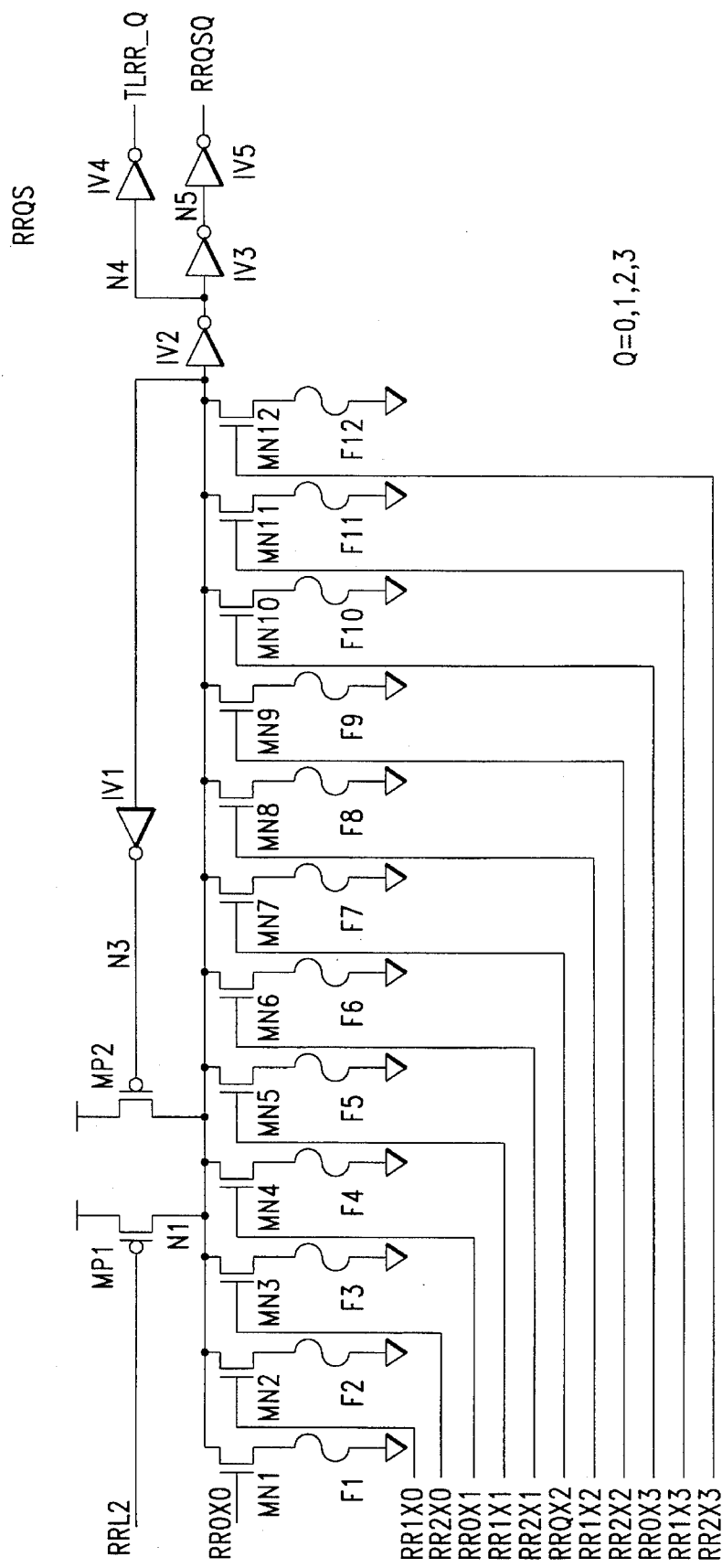
FIG. 9 is the circuit diagram of RRQS row redundant quadrant selection.

FIG. 9 shows the RRQS (ROW redundant quadrant selection) circuit. It can make use of the fuse decoder shown in FIG. 8. The address bit signal is decoded and the quadrant to which the redundant row belongs is identified. The device has four RRQS circuits, each of which selects the quadrant of the array. The RRQS circuit is designed as a 12-input "NOR" gate. When this circuit is designed, if the redundant address does not belong to the repaired quadrant, the fuses corresponding to RRQS are blown. The fuses are not blown with respect to the repaired row for the quadrant [sic]. In this way, in the case when the redundant row is addressed and belongs to the quadrant, node N1 always takes on the low level, and activated output RRQS signals, that is, TLR_Q and RRQSQ, are generated. In the case when the redundant row does not belong to the quadrant or it is not the addressed redundant row, node N1 remains on the high level. The RRL2 signal is used in turning MP1 on and to charge N1 to the high level during prechange. In the case when MP2 having the inverter IV1 is not selected, [it is] used for holding node N1 at the precharge level. Attention should be put on the fact that by means of appropriate design, for the redundant address, any number of activated quadrants can be selected. This is realized by not blowing the fuses corresponding to the selected address in the RRQS circuit concerning the quadrant having the repaired row. When the fuse of RRQS circuit is blown, the predecoded address bit signal is applied to the gate of the transistor, and the potential of node N1 is not discharged. On the other hand, if the fuse is not blown, the selected transistor discharges node N1, and the output of inverter IV2 can be set to the logical high level.

Figure 10:
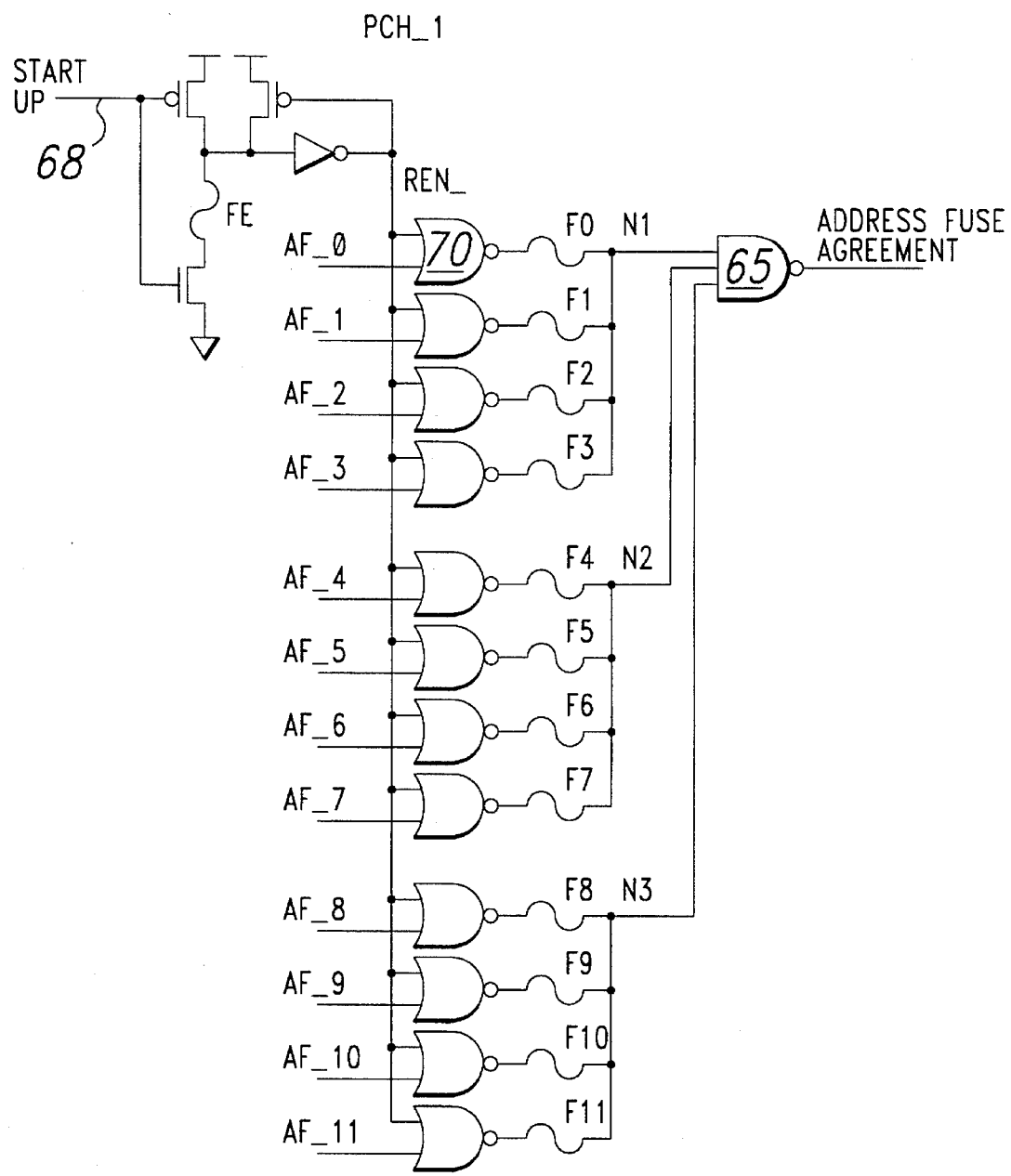
FIG. 10 is a circuit diagram of the fuse decoder of the redundant address coincidental circuit.

FIG. 10 shows the fuse decoder of another redundant address coincidental circuit. It also makes use of the fuse decoder shown in FIG. 8. In the case when the redundant memory is used, it is only necessary to blow energized fuse FE. The p channel transistor PCH_1 is energized by start signal STARTUP and generates REN_ signal. Logic operation is performed by the "NAND" logic gate for the various input signals from N1 to N3 "OR" connected via the programmable fuses to the "NOR" logic output of REN_ signal and address signals AF_0–AF11. In this way, it is judged by the device that a redundant memory is to be used. Although four fuses are set in parallel as a group, for each "NOR" gate, with the high resistance after the series-connected fuse is blown or with the medium resistance due to incomplete blowing, it is impossible to reach the logic level of the "NAND" logic gate in the next stage. Consequently, the agreement signal of the address has a high reliability. In addition, although the fan-out of p channel transistor PCH_1 is large, in the conventional operation state, a transistor with the conventional size is enough for driving about 12 gates.

This invention has been explained above in detail with reference to the embodiments. However, these examples are only for explanation of the invention, they have no limiting function. In addition, many changes can be made in the detailed features of the embodiments of the invention, and they can be made by specialists in this field with reference to the above explanation. In the above description, this invention was explained with respect to DRAM. However, it may also be used as the redundant configuration for any other type of memory containing read-only memory (ROM) and static random access memory (SRAM). In addition, the n channel transistors may be replaced by p channel transistors. Furthermore, the field-effect transistors may be replaced by bipolar transistors with the same effect. Here, the field-effect transistors may be MOS transistors. These configurations may be formed on an IC by using conventional semiconductor manufacturing technology. All of these variations and other embodiments are included in the real range and technical ideas of this invention.

The effects of the invention disclosed above may be summarized as follows.

(1) In a semiconductor IC, the defective memory cell caused by short circuit of the word lines can be replaced by the row redundant memory cell group, and the defective memory cell due to a defective bit can be replaced by the other redundant row memory.

(2) Since both the fuse decoders dedicated to the redundant word line group and the fuse decoders dedicated to the redundant word line are set in a single memory chip, the overall area of the fuse decoder can be reduced.

(3) It provides a type of semiconductor IC characterized by the fact that the manufacturing yield can be increased.

We claim:

1. A semiconductor memory device comprising:

a plurality of memory blocks, each of said memory blocks having an array of memory cells provided thereon arranged in a matrix of rows and columns of individual memory cells each array of memory cells including a main array sector of rows and columns of memory cells as part of a regular memory configuration, at least some of the arrays of memory cells including a redundant group of a plurality of one of the rows and columns of memory cells as redundant memory;

a plurality of redundant group selection lines corresponding in number to the plurality of said one of the rows and columns of memory cells included in each of said redundant groups;

the plurality of said one of the rows and columns of memory cells included in each of said redundant groups having a first redundant address of a portion only of the number of address bits to be provided on an address signal line for addressing memory cells of the regular memory configuration;

a first plurality of programmable fuses respectively connected to an address signal line;

a redundant memory address group decoder for selecting one redundant group of a plurality of said one of the rows and columns of memory cells in response to the first redundant address defined by said portion of the address bits provided on the address signal line;

a second plurality of programmable fuses respectively connected to the address signal line; and a redundant memory address decoder for selecting a portion of a selected one redundant group in response to a second redundant address having a number of address bits constituting all of the address bits as provided on the address signal line to define the address of a memory cell.

2. A semiconductor memory device as set forth in claim 1, wherein the plurality of said one of the rows and columns of memory cells included in each of said redundant groups comprises a plurality of rows of redundant memory cells.

3. A semiconductor memory device as set forth in claim 2, wherein the respective rows of redundant memory cells included in a redundant group of memory cells as redundant memory are word lines.

4. A semiconductor memory device as set forth in claim 2, wherein said redundant memory address group decoder and said redundant memory address decoder are combined in a redundant decoder circuit for selecting one or a plurality of redundant rows included in a selected redundant group of a plurality of rows of memory cells.

5. A semiconductor memory device as set forth in claim 1, wherein alternate memory blocks of said plurality of memory blocks are provided with a main array sector of rows and columns of memory cells as part of the regular memory configuration and a redundant array of memory cells including a group of a plurality of one of the rows and columns of memory cells as redundant memory.

6. A semiconductor memory device as set forth in claim 1, wherein the portion of the address bits on the address signal line provided as the first redundant address of a redundant group of memory cells comprises one-half of all of the address bits provided on the address signal line as the second redundant address.

* * * * *